United States Patent
Yoon et al.

(10) Patent No.: US 11,515,354 B2
(45) Date of Patent: Nov. 29, 2022

(54) THIN FILM TRANSISTOR ARRAY SUBSTRATE FOR DIGITAL X-RAY DETECTOR DEVICE AND DIGITAL X-RAY DETECTOR DEVICE INCLUDING THE SAME

(71) Applicant: LG Display Co., Ltd., Seoul (KR)

(72) Inventors: Jaeho Yoon, Gyeongsangbuk-do (KR); Moonsoo Kang, Daegu (KR); Donghyeon Jang, Jinju-si (KR); Shihyung Park, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 107 days.

(21) Appl. No.: 17/106,980

(22) Filed: Nov. 30, 2020

(65) Prior Publication Data

US 2021/0175274 A1    Jun. 10, 2021

(30) Foreign Application Priority Data

Dec. 6, 2019  (KR) .......................... 10-2019-0161893

(51) Int. Cl.
*H01L 27/146*  (2006.01)
*H01L 31/105*  (2006.01)

(52) U.S. Cl.
CPC .. *H01L 27/14658* (2013.01); *H01L 27/14612* (2013.01); *H01L 31/105* (2013.01)

(58) Field of Classification Search
CPC ......... H01L 27/14658; H01L 27/14612; H01L 31/105; H01L 31/115; H01L 27/1461; H01L 27/14663; H01L 27/14603; H01L 31/035272; G01T 1/161; G01T 1/243; G01T 1/24

See application file for complete search history.

(56) References Cited

U.S. PATENT DOCUMENTS

| | | | | |
|---|---|---|---|---|
| 6,107,619 | A   * | 8/2000 | Cunningham | .... H01L 27/14634 257/463 |
| 2009/0146179 | A1 * | 6/2009 | Chen | ............... H01L 31/035281 398/183 |
| 2012/0049076 | A1 * | 3/2012 | Tredwell | ........... H01L 27/14658 438/66 |
| 2012/0161018 | A1 * | 6/2012 | Shin | .................. H01L 27/14658 250/370.09 |
| 2016/0359075 | A1 * | 12/2016 | Zhao | ................. H01L 27/14663 |

FOREIGN PATENT DOCUMENTS

KR      10-1942423 B1      4/2019

* cited by examiner

*Primary Examiner* — Kiho Kim
(74) *Attorney, Agent, or Firm* — Polsinelli PC

(57) ABSTRACT

A thin film transistor array substrate for a digital X-ray detector device includes a p+ type semiconductor layer and a p− type semiconductor layer having different impurity concentrations are disposed above an intrinsic semiconductor layer of the PIN diode and an n+ type semiconductor layer and an n− type semiconductor layer having different impurity concentrations are disposed below the intrinsic semiconductor layer of the PIN diode to minimize ejection of holes by the p− type semiconductor layer and minimize ejection of electros by the n− type semiconductor layer, thereby minimizing occurrence of leakage current of the PIN diode.

13 Claims, 7 Drawing Sheets

THIN FILM TRANSISTOR ARRAY SUBSTRATE FOR DIGITAL X-RAY DETECTOR DEVICE AND DIGITAL X-RAY DETECTOR DEVICE INCLUDING THE SAME

CROSS-REFERENCE TO RELATED APPLICATION

The present disclosure claims priority to and the benefit of Korean Patent Application No. 10-2019-0161893, filed on Dec. 6, 2019, which is hereby incorporated by reference in its entirety.

BACKGROUND

Field of the Disclosure

The present disclosure relates to a thin film transistor array substrate for a digital X-ray detector device for minimizing leakage current of a PIN diode and the digital X-ray detector device including the same.

Description of the Background

Because X-ray is of a short wavelength, the X-ray may pass through an object easily. The transmittance of the X-ray depends on an inner density of the object. Therefore, an internal structure of the object may be observed by detecting an amount of the X-ray transmitted through the object.

One of X-ray based inspection methods used in a medical field is a film printing scheme. However, in the film printing scheme, to check a result, an image is shot, and then a film is printed. Thus, it takes a long time to check the result. Especially, in the film printing scheme, there are some difficulties in storing and preserving the printed film.

A digital X-ray detector (DXD) device using a thin film transistor has been developed and widely used in the medical field.

The DXD device detects the transmittance of the X-ray transmitted through the object and displays an internal state of the object on a display based on the transmittance.

Therefore, the digital X-ray detector device may display the internal structure of the object without using an additional film and printed paper. Further, the DXD device may check the results in real time immediately after X-ray photographing.

SUMMARY

A digital X-ray detector device detects current inside a digital X-ray detection panel to implement an image based on the current and includes a photo PIN (p type semiconductor-intrinsic type semiconductor-n type semiconductor) diode.

The digital X-ray detector device may minimize noise generated in an X-ray image to obtain an accurate and clear image desired by users.

As the noise may be generated based on leakage current, which occurs after a reverse voltage is applied to the top of the PIN diode, the leakage current generated by the PIN diode may be minimized.

Accordingly, the inventors of the present disclosure invented a thin film transistor array substrate for a digital X-ray detector device and the digital X-ray detector device capable of minimizing the leakage current generated by the PIN diode.

The present disclosure provides a thin film transistor array substrate for a digital X-ray detector device and the digital X-ray detector device capable of minimizing the leakage current of the PIN diode.

The present disclosure further provides a thin film transistor array substrate for a digital X-ray detector device and the digital X-ray detector device capable of minimizing a reduction in transmittance of light incident on the PIN diode.

The present disclosure is not limited to the above-mentioned objects, and the other objects and advantages of the present disclosure, which are not mentioned, may be understood by the following description, and more clearly understood by the aspects of the present disclosure. It is also readily understood that the objects and the advantages of the present disclosure may be implemented by features described in appended claims and a combination thereof.

According to an aspect of the present disclosure, there are provided a thin film transistor array substrate for a digital X-ray detector device and the digital X-ray detector device capable of minimizing the generation of the leakage current as well as minimizing the reduction of light transmittance of PIN diodes.

According to an aspect of the present disclosure, the thin film transistor array substrate for the digital X-ray detector device and the digital X-ray detector device include a base substrate, a driving thin film transistor disposed on the base substrate, and a PIN diode connected to the driving thin film transistor and including a lower electrode, a PIN layer, and an upper electrode and the PIN layer includes a p+ type semiconductor layer, a p– type semiconductor layer, an I (intrinsic) semiconductor layer, an n– type semiconductor layer, and an n+ type semiconductor layer.

In this case, the p+ type semiconductor layer and the p– type semiconductor layer each contain p type impurities, the p– type semiconductor layer has a lower concentration of p type impurities than that of the p+ type semiconductor layer, and the p type impurity may include at least one of Group 3 elements.

In addition, the n+ type semiconductor layer and the n– type semiconductor layer each contain n type impurities, the n– type semiconductor layer has a lower concentration of n type impurities than that of the n+ type semiconductor layer, and the n type impurity may include at least one of Group 5 elements.

In addition, according to another aspect of the present disclosure, the p+ type semiconductor layer may have the same thickness as the n+ type semiconductor layer and the p– type semiconductor layer may have the same thickness as the n– type semiconductor layer.

According to the present disclosure, multi-p type semiconductor layer including the p+ type semiconductor layer and the p– type semiconductor layer having different impurity concentrations is disposed above the intrinsic semiconductor layer of the PIN diode and multi-n type semiconductor layer including the n+ type semiconductor layer and the n– type semiconductor layer having different impurity concentrations is disposed below the intrinsic semiconductor layer to minimize ejection of holes by the p– type semiconductor layer and ejection of electrons by the n– type semiconductor layer, thereby minimizing occurrence of the leakage current of the PIN diode.

In addition, according to the present disclosure, a p– type semiconductor layer having a low concentration of impurities is disposed under a p+ type semiconductor layer having a high concentration of impurities and an n– type semiconductor layer having a low concentration of impurities is disposed on the n+ type semiconductor layer having a high concentration of impurities to minimize the reduction in the light transmittance of the PIN diode due to the high concentration of impurities.

Specific effects of the present disclosure, in addition to the above-mentioned effects, will be described together as well as describing specific matters to implement the present disclosure.

BRIEF DESCRIPTION OF THE DRAWINGS

The accompanying drawings, which are included to provide a further understanding of the disclosure and are incorporated in and constitute a part of the present disclosure, illustrate aspect(s) of the disclosure and together with the description serve to explain the principle of the disclosure.

In the drawings.

DETAILED DESCRIPTION

Figure 1:
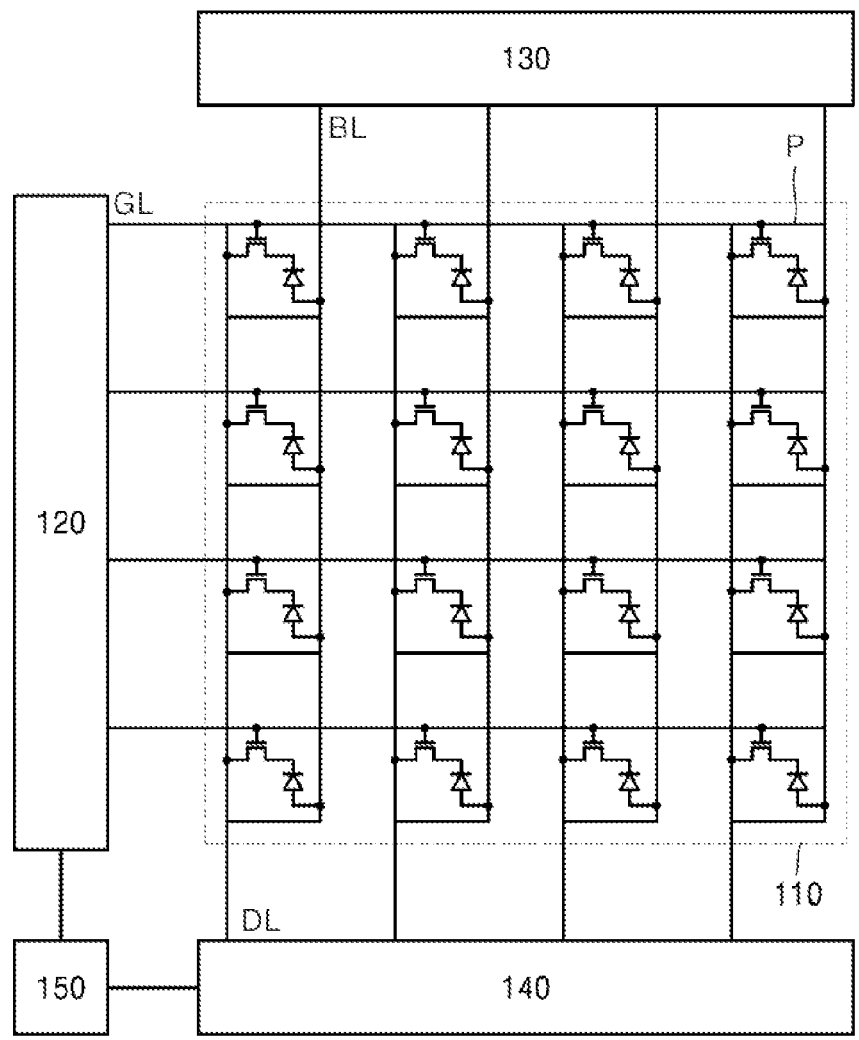
FIG. 1 is a schematic block diagram showing an example digital X-ray detector device.

Some aspects of the present disclosure are described in detail with reference to the accompanying drawings. Accordingly, the skilled person in the art to which the present disclosure pertains may easily implement the technical idea of the present disclosure. In the description of the present disclosure, if it is determined that a detailed description of a well-known technology relating to the present disclosure may be omitted if it unnecessarily obscures the gist of the present disclosure. One or more aspects of the present disclosure are described in detail with reference to the accompanying drawings. In the drawings, same reference numerals may be used to refer to same or similar components.

In this document, the terms "upper," "lower," "on," "under," or the like are used such that, where a first component is arranged at "an upper portion" or "a lower portion" of a second component, the first component may be arranged in contact with the upper surface (or the lower surface) of the second component, or another component may be disposed between the first component and the second component. Similarly, where a first component is arranged on or under a second component, the first component may be arranged directly on or under (in contact with) the second component, or one or more other components may be disposed between the first component and the second component.

Further, the terms "connected," "coupled," or the like are used such that, where a first component is connected or coupled to a second component, the first component may be directly connected or able to be connected to the second component, or one or more additional components may be disposed between the first and second components, or the first and second components may be connected or coupled through one or more additional components.

Hereinafter, a thin film transistor array substrate for a digital X-ray detector device according to some aspects of the present disclosure and the digital X-ray detector device including the same are described.

FIG. 1 is a schematic block diagram showing a digital X-ray detector device. The digital X-ray detector device may include a thin film transistor array 110, a gate driver 120, a bias supply 130, a readout circuitry 140, and a timing controller 150.

The thin film transistor array 110 may include a plurality of cell regions defined by a plurality of gate lines GL arranged in a first direction and by a plurality of data lines DL arranged in a second direction orthogonal to the first direction.

The cell regions are arranged in a matrix configuration. Each cell region may include a pixel region in which photo-sensitive pixels Ps are disposed. The thin film transistor array 110 may detect the X-ray emitted from an X-ray source, may convert the detected X-ray into an electrical signal, and may output the electrical signal.

Each photo-sensitive pixel may include a PIN diode which converts light of a visible light region converted from the X-ray by a scintillator into an electrical signal and outputs the electrical signal and a thin film transistor TFT that transmits a detected signal output from the PIN diode to a readout circuitry 140. A first end of the PIN diode may be connected to the thin film transistor and a second end thereof may be connected to a bias line BL.

A gate electrode of the thin film transistor may be connected to the gate line GL which carries a scan signal. Source/drain electrodes of the thin film transistor may be respectively connected to the PIN diode and a data line DL which carries the detected signal output from the PIN diode. Each bias line BL may extend in a parallel manner to each data line DL.

The gate driver 120 may sequentially apply gate signals to thin film transistors of photo-sensitive pixels through the gate lines GLs. The thin film transistors of the photo-sensitive pixels may be turned on in response to the gate signals having a gate-on voltage level.

The bias supply 130 may apply driving voltages to the photo-sensitive pixels through the bias lines BL. The bias supply 130 may selectively apply a reverse bias or a forward bias to the PIN diode.

The readout circuitry 140 may read out the detected signal received from the thin film transistor turned on in response to the gate signal of the gate driver. For example, the detected signal output from the PIN diode may be input to the readout circuitry 140 through the thin film transistor and the data line DL.

The readout circuitry 140 may have an offset readout period for which an offset image is read out and an X-ray readout period for which the detected signal after an X-ray exposure is read out and may read out the detected signal output from the photo-sensitive pixels during the X-ray readout period.

The readout circuitry 140 may include a signal detector and a multiplexer. The signal detector includes a plurality of amplification circuits that correspond respectively to the data lines DL. Each amplification circuit may include an amplifier, a capacitor, and a reset element.

The timing controller 150 may control an operation of the gate driver 120 by generating a start signal and a clock signal and supplying each of the start signal and the clock signal to the gate driver 120. Further, the timing controller 150 may control an operation of the readout circuitry 140 by generating a readout control signal and a readout clock signal and supplying each of the readout control signal and the readout clock signal to the readout circuitry 140.

Figure 2:
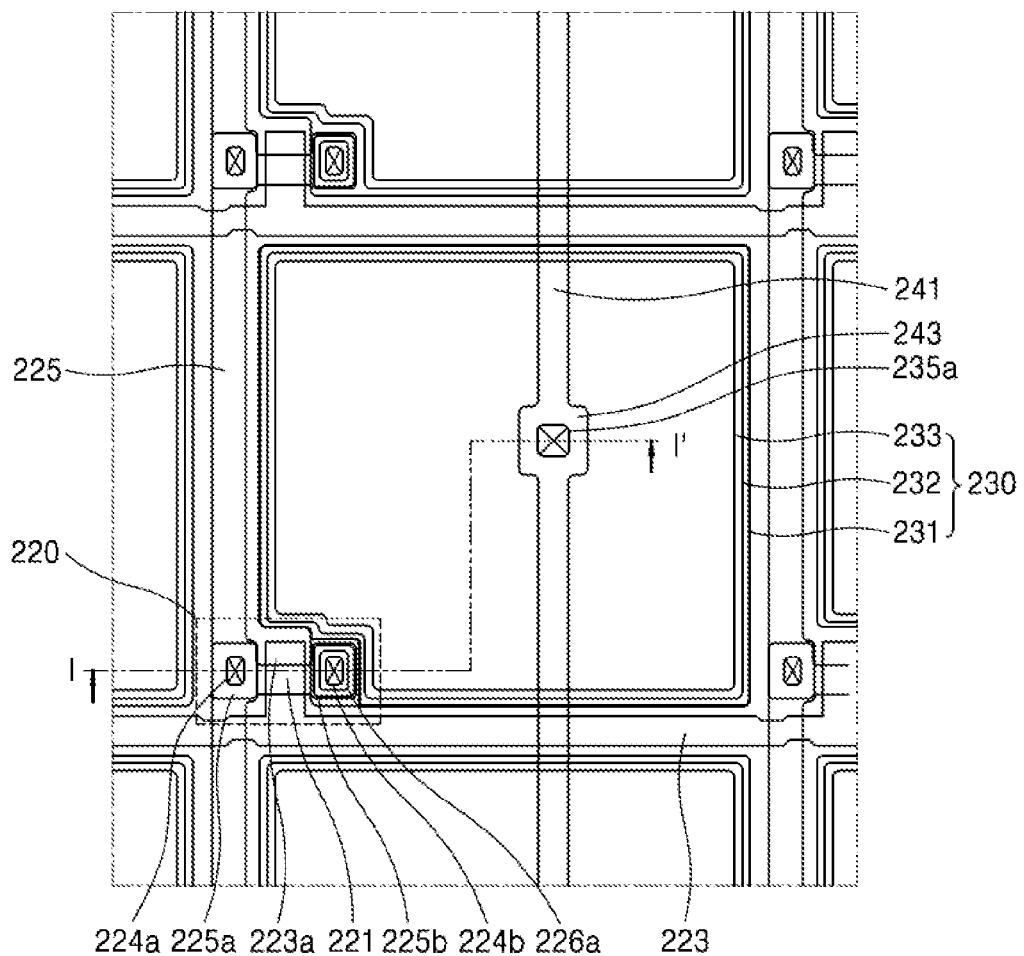
FIG. 2 is a plan view showing an example area of a digital X-ray detector device.
Figure 3:
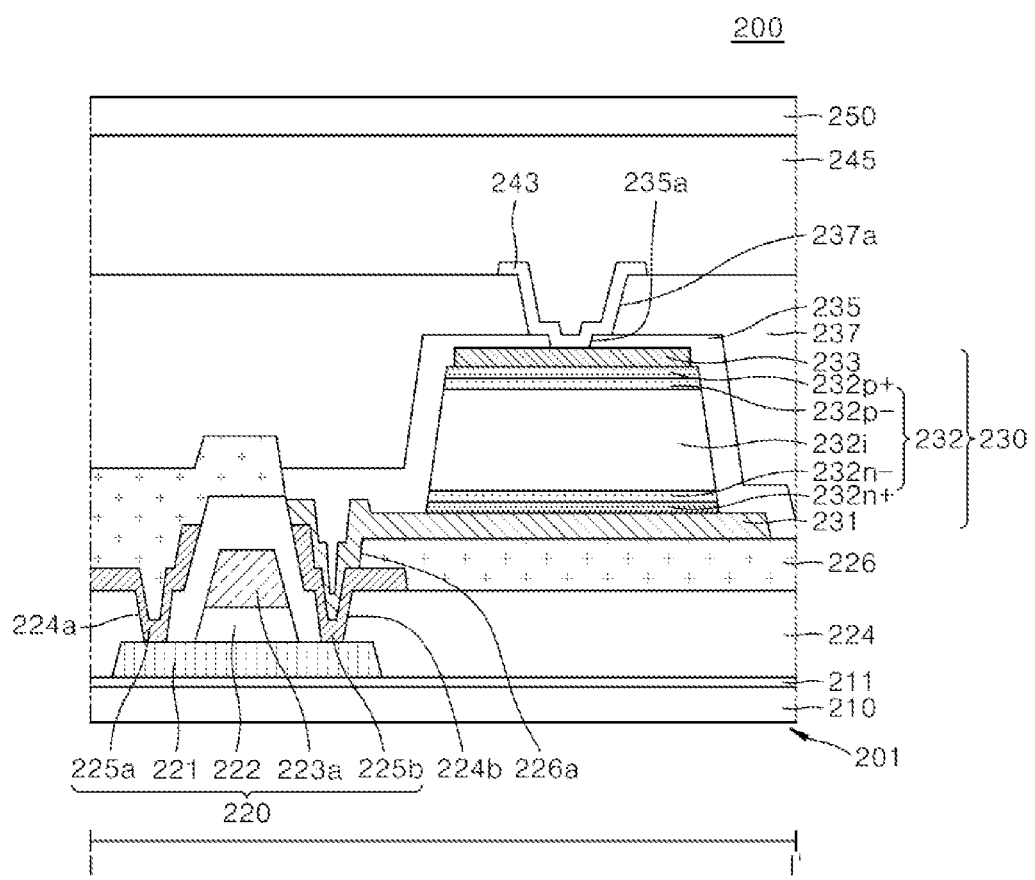
FIG. 3 is a cross-sectional view showing an example area taken along line I-I' of a digital X-ray detector device.
Figure 4:
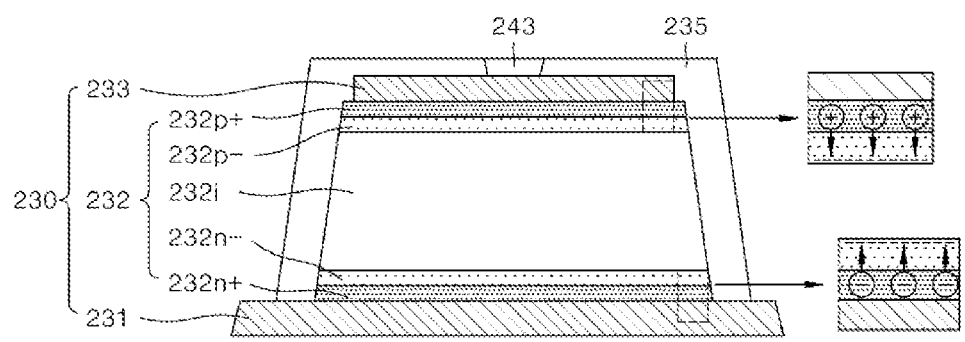
FIG. 4 is an enlarged cross-sectional view showing an example PIN diode.

Hereinafter, a digital X-ray detector device 200 according to one aspect of the present disclosure is described in detail with reference to FIG. 2 to FIG. 4.

A digital X-ray detector device 200 according to one aspect of the present disclosure includes a base substrate 210.

The base substrate 210 may be embodied as a glass substrate made of glass, but is not limited thereto. In some cases where the base substrate 210 is used for a flexible digital X-ray detector device, a substrate made of polyimide material and having flexible properties may be used as an example of the base substrate 210.

On the base substrate 210, a plurality of cell regions are defined by a plurality of gate lines 223 and a plurality of data lines 225 intersecting with each other in an orthogonal manner. Each pixel may correspond to each cell region to define a plurality of pixel regions. A region corresponding to the gate line 223 and the data line 225 may be defined as a boundary region between pixel regions.

Each pixel includes the thin film transistor 220 and the PIN diode 230. The plurality of thin film transistors 220 and the plurality of PIN diodes 230 may be disposed on an array substrate having the plurality of pixel regions. The thin film transistor 220 and the PIN diode 230 of the pixel are described below and this configuration may also be applied to adjacent pixels unless otherwise specified.

A thin film transistor 220 including a first electrode 225a, a second electrode 225b, a gate electrode 223a, and an active layer 221 is disposed above the base substrate 210.

A buffer layer 211 may be disposed between the base substrate 210 and the thin film transistor 220. In this case, the buffer layer 211 may be made of an inorganic material such as silicon oxide (SiOx) or silicon nitride (SiNx) and may be provided as a multi-buffer layer composed of multiple sub-layers.

The active layer 221 is disposed above the base substrate 210. The active layer 221 may be made of an oxide semiconductor material such as indium gallium zinc oxide (IGZO), but is not limited thereto, and may be made of low temperature polycrystalline silicon (LTPS) or amorphous silicon (a-Si).

The active layer 221 may include, for example, a channel region and conducting regions, where the channel region is disposed between two conducting regions. In some examples, the conducting regions may be divided into a first conducting region connected in direct contact with a first electrode 225a and a second conducting region connected in direct contact with a second electrode 225b.

The conducting regions of the active layer 221 may be formed by conducting both ends of the active layer 221 and various types of methods such as a dry etching method, a hydrogen plasma treatment, a helium plasma treatment, and the like may be used as examples of a conducting treatment method.

A gate electrode 223a is disposed above the active layer 221 and a gate insulating layer 222 is disposed between the active layer 221 and the gate electrode 223a to insulate the active layer 221 from the gate electrode 223a.

For example, the gate electrode 223a may be disposed on the gate insulating layer 222 to correspond to the channel region of the active layer 221. The gate electrode 223a may be made of one selected from a group consisting of molybdenum (Mo), aluminum (Al), chromium (Cr), gold (Au), titanium (Ti), nickel (Ni), copper (Cu) and alloys thereof and may include a single layer or a multiple layers.

The gate electrode 223a may extend from a gate line 223. The gate line 223 and the gate electrode 223a may be integrated with each other such that the gate electrode 223a is disposed in the gate line 223. Accordingly, the gate line 223 and the gate electrode 223a may be disposed on the same layer.

The gate insulating layer 222 made of an inorganic material is disposed under the gate electrode 223a and may have the same or greater area than that of the gate electrode 223a for effective insulation.

The gate electrode 223a and the gate insulating layer 222 may each be disposed at a central region of the active layer 221. In this example, a first area of the active layer 221 exposed by not being overlaid by the gate electrode 223a, for example, a first end of the active layer 221 other than the channel region may be a first conducting region and a second area of the active layer 221 exposed by not being overlaid by the gate electrode 223a, for example, a second end of the active layer 221 other than the channel region may be a second conducting region.

In this case, the first conducting region may be a drain region and the second conducting region may be a source region.

The source region of the active layer 221 may be disposed closer to the PIN diode 230 than the drain region, but is not limited thereto, and the positions of the source region and the drain region may be interchanged.

An interlayer insulating layer 224 made of an inorganic material may be disposed on the gate electrode 223a to overlay the base substrate 210. The first electrode 225a and the second electrode 225b may each be disposed on the interlayer insulting layer 224.

The first electrode 225a may be disposed at a first side of the active layer 221 and the second electrode 225b may be disposed at the second side of the active layer 221. Accordingly, the gate electrode 223a may be disposed between the first electrode 225a and the second electrode 225b. A first contact hole 224a may be provided in the interlayer insulating layer 224 at an area in which the active layer 221 overlaps with the first electrode 225a and a second contact hole 224b may be provided in the interlayer insulating layer 224 at an area in which the active layer 221 overlaps with the second electrode 225b.

In some examples, the first contact hole 224a may be provided on the drain region of the active layer 221 and the second contact hole 224b may be provided on the source region of the active layer 221. Accordingly, the first electrode 225a is connected to the drain region of the active layer 221 through the first contact hole 224a and the second electrode 225b may be connected to the source region of the active layer 221 through the second contact hole 224b.

Accordingly, the first electrode 225a connected to the drain region may be a drain electrode and the second electrode 225b connected to the source region may be a source electrode.

The first electrode 225a and the second electrode 225b may each extend from the data line 225 and may each be disposed on the same layer as the data line 225.

The data line 225 may be made of, but is not limited to, one selected from a group consisting of molybdenum (Mo), aluminum (Al), chromium (Cr), gold (Au), titanium (Ti), nickel (Ni), copper (Cu) and alloys thereof.

A first passivation layer 226 may be disposed on or above the thin film transistor 220 to overlay a whole surface of the base substrate. The first passivation layer 226 may made of an inorganic material such as silicon oxide (SiOx) or silicon nitride (SiNx), but is not limited thereto. The first passivation layer 226 may protect the lower thin film transistor 220, for example, the active layer 221.

The PIN diode 230 is disposed on the first passivation layer 226 to be connected to the lower thin film transistor 220. The PIN diode 230 may be disposed in the pixel region.

The PIN diode 230 may include a lower electrode 231 connected to the thin film transistor 220, a PIN layer 232 on the lower electrode 231, and an upper electrode 233 on the PIN layer 232.

The lower electrode 231 may serve as a pixel electrode in the PIN diode 230. The lower electrode 231 may be made of an opaque metal such as molybdenum Mo or at least one of transparent oxides such as indium tin oxide (ITO), indium zinc oxide (IZO), and zinc oxide (ZnO), depending on characteristics of the PIN diode 230.

The lower electrode 231 may be connected to the second electrode 225b of the thin film transistor 220 via a third contact hole 226a as a contact hole in the first passivation layer 226, such that the thin film transistor 220 may be connected to the PIN diode 230.

The PIN layer 232 may be disposed on the lower electrode 231 to convert a visible light, which has been converted from the X-ray, into an electrical signal. In this connection, a scintillator may convert the X-ray into the visible light.

The PIN layer 232 may be disposed by sequentially stacking, on the lower electrode 231, an n+ type semiconductor layer containing n type impurities having a high concentration, a n− type semiconductor layer containing n type impurities and having a low concentration, an I (Intrinsic) type semiconductor layer 232i, a p− type semiconductor layer containing p type impurities having a low concentration, and a p+ type semiconductor layer containing p type impurities having a high concentration.

The I type semiconductor layer may be relatively thicker than each of the n+ type semiconductor layer and the n− type semiconductor layer, the p− type semiconductor layer, and the p+ type semiconductor layer. The PIN layer 232 may be made of a material capable of converting the visible light into which the X-ray emitted from an X-ray source is converted into an electrical signal, for example, a-Se, $HgI_2$, CdTe, PbO, $PbI_2$, $BiI_3$, GaAs, and Ge.

The upper electrode 233 may be disposed on the PIN layer 232. The upper electrode 233 may be made of at least one of transparent oxides such as indium tin oxide (ITO), indium zinc oxide (IZO), and zinc oxide (ZnO) and may improve a fill factor of the PIN diode 230.

A second passivation layer 235 may be disposed above the PIN diode 230. The second passivation layer 235 may be made of an inorganic material such as silicon oxide (SiOx) or silicon nitride (SiNx), but is not limited thereto. The second passivation layer 235 may cover up to a side surface of the PIN diode 230 to protect the side surface of the PIN diode 230 from moisture or other foreign substances.

A bias electrode 243 may be disposed on the second passivation layer 235 on the PIN diode 230. The bias electrode 243 may be connected to the upper electrode 233 of the PIN diode 230 via a fourth contact hole 235a as a contact hole in the second passivation layer 235 and may apply a bias voltage to the PIN diode 230.

The bias electrode 243 may be branched from a bias line 241 arranged in parallel to the data line 225.

In this case, a first planarization layer 237 may be disposed between the second passivation layer 235 and the bias electrode 243 to overlay a whole surface of the base substrate 210 including the PIN diode 230.

The first planarization layer 237 may be made of an organic material such as PAC (Photo Acryl), but is not limited thereto.

In this case, a fifth contact hole 237a is disposed in the first planarization layer 237 to expose the upper electrode 233 to a position of the second passivation layer 235 corresponding to the fourth contact hole 235a. The bias electrode 243 may be electrically connected to the upper electrode 233 through the fourth contact hole 235a and the fifth contact hole 237a.

The second planarization layer 245 may be disposed on the bias electrode 243 to overlay a whole surface of the base substrate 210.

The second planarization layer 245 may be made of an organic material such as photo acryl (PAC), but is not limited thereto.

A scintillator layer 250 may be disposed on the second planarization layer 245 to overlay the PIN diode 230.

In some examples, the scintillator layer 250 is disposed above each of the thin film transistor 220 and the PIN diode 230 to overlay each of the thin film transistor 220 and the PIN diode 230.

As the scintillator layer 250 may be directly deposited on the array substrate 201, the planarization of a lower surface of the scintillator layer 250 may be needed. Therefore, the second planarization layer 245 is disposed to planarize the lower surface of the scintillator layer 250 to thereby facilitate the formation of the scintillator layer 250 by deposition of the scintillator.

The scintillator layer 250 may be grown in a vertical direction to have a plurality of columnar crystal phases, such that a plurality of scintillator columnar crystals may be arranged in a side-by-side manner, but is not limited thereto. The scintillator may be made of a material such as cesium iodide (CsI), but is not limited thereto.

The digital X-ray detector device 200 according to the present disclosure operates as follows.

X-ray is irradiated to the digital X-ray detector device 200. The scintillator layer 250 converts the X-ray into the visible light. The PIN layer 232 of the PIN diode 230 converts the light in the visible region into an electrical signal.

For example, when the light in the visible region is irradiated to the PIN layer 232, the I-type semiconductor layer is depleted by each of the n type semiconductor layer and the p type semiconductor layer, thereby generating an electric field therein. Then, holes and electrons generated by the light drift based on the electric field and are collected into the p type semiconductor layer and the n type semiconductor layer, respectively.

The PIN diode 230 converts the light in the visible region into the electrical signal and transmits the electrical signal to the thin film transistor 220. The electrical signal thus transmitted is displayed as an image signal via the data line 225 connected to the thin film transistor 220.

The PIN diode 230 according to an aspect of the present disclosure is described in detail with reference to FIG. 4.

According to an aspect of the present disclosure, the PIN diode includes a lower electrode, a PIN layer, and an upper electrode and the PIN layer includes a p+ type semiconductor layer, a p− type semiconductor layer, an intrinsic semiconductor layer, an n− type semiconductor layer, and an n+ type semiconductor layer.

In some examples, the PIN layer is formed by sequentially stacking, on the lower electrode, the n+ type semiconductor layer, the n− type semiconductor layer, the intrinsic semiconductor layer, the p− type semiconductor layer, and the p+ type semiconductor layer.

The p+ type semiconductor layer and the p− type semiconductor layer each contain p type impurities and are doped with p type impurities containing at least one of Group 3 elements such as boron (B).

The p+ type semiconductor layer is doped with a high concentration of p type impurities, the p− type semiconductor layer is doped with a low concentration of p type impurities, and the p− type semiconductor layer is doped with a lower concentration of p type impurities than that of the p+ type semiconductor layer.

In this case, the p− type semiconductor layer may contain p type impurities corresponding to 1/20 to 1/10 of p type impurities of the p+ type semiconductor layer.

The n+ type semiconductor layer and the n− type semiconductor layer each contain n type impurities and may each be doped with n type impurities including at least one of Group 5 elements such as phosphorus (P), arsenic (As), and antimony (Sb).

The n+ type semiconductor layer is doped with a high concentration of n type impurities, the n− type semiconductor layer is doped with a low concentration of n type impurities, and the n− type semiconductor layer is doped with a lower concentration of n type impurities than that of the n+ type semiconductor layer.

In this case, the n− type semiconductor layer may include n type impurities corresponding to 1/10 to 1/5 of n type impurities of the n+ type semiconductor layer.

For example, according to the present disclosure, the p− type semiconductor layer and the p+ type semiconductor layer are each disposed above the intrinsic semiconductor layer and the n− type semiconductor layer and the n+ type semiconductor layer are each disposed below the intrinsic semiconductor layer in the PIN layer of the PIN diode. That is, multi-doping layers are disposed above and below the intrinsic semiconductor layer to minimize the leakage current of the PIN diode. This configuration is described below in detail.

In an off state in which light is not applied to the PIN diode, but a reverse bias voltage is applied, electrons and hole pairs are not provided in the PIN diode, and thus, current may not flow.

The intrinsic semiconductor layer of the PIN diode is an area where electrons and hole pairs meet and functions as a condenser or a variable resistor depending on the applied voltage.

As the digital X-ray detector device operates based on the current generated in proportion to applied light when the light is applied to the PIN diode that absorbs the light, maintaining a low current state in the off state is important to the characteristics of the digital X-ray detector device.

As the PIN diode may be implemented with a thin film having a thickness of at least several tens of nanometers (nm), leakage current may be generated for various reasons even if the reverse voltage is applied.

For example, the leakage current may be generated along a side surface of the PIN diode that directly contacts the passivation layer and the leakage current may also be generated by impurities in the intrinsic semiconductor layer.

In particular, the digital X-ray detector device is sensitive to leakage current because the digital X-ray detector device adjusts values in femtoampere (fA) unit. Therefore, the digital X-ray detector device is important to minimize the leakage current.

Accordingly, according to the present disclosure, one p type semiconductor layer may not be disposed above the intrinsic semiconductor layer, but multi-p type semiconductor layer including the p+ type semiconductor layer and the p− type semiconductor layer having different impurity concentrations may be disposed above the intrinsic semiconductor layer, and an n type semiconductor layer is not disposed below the intrinsic semiconductor layer, but multi-n type semiconductor layer including the n+ type semiconductor layer and the n− type semiconductor layer having different impurity concentrations may be disposed below the intrinsic semiconductor layer to prevent the ejection of the holes and electrons, thereby minimizing the occurrence of the leakage current.

The holes are accumulated in the p type semiconductor layer disposed above the intrinsic semiconductor layer and the electrons are accumulated in the n type semiconductor layer disposed below the intrinsic semiconductor layer based on the reverse voltage applied to the PIN diode and the intrinsic semiconductor layer is in a depletion state.

In this case, the holes in the p type semiconductor layer and the electrons in the n type semiconductor layer are ejected to generate the leakage current.

According to the present disclosure, as the multi-p type semiconductor layer including the p+ type semiconductor layer and the p− type semiconductor layer are provided, even if the holes are ejected from the p+ type semiconductor layer, the holes may not be ejected below the p+ type semiconductor layer due to an electrical field generated in the p− type semiconductor layer and are trapped in the p− type semiconductor layer.

Similarly, as the multi-n type semiconductor layer including the n+ type semiconductor layer and the n-type semiconductor layer are provided, even if the electrons are ejected from the n+ type semiconductor layer, the electrons may not be ejected above the n+ type semiconductor layer due to the electrical field generated in the n− type semiconductor layer and are trapped in the n− type semiconductor layer.

According to the present disclosure, there are provided the multi-p type semiconductor layer and the multi-n type semiconductor layer having different impurity concentrations to minimize the reduction of the light transmittance of the PIN diode and effectively minimize the ejection of the holes and the electrons.

Even if the p type semiconductor layer includes a p+ type semiconductor layer having a thick thickness to prevent the ejection of some holes, light transmission may be blocked by the p+ type semiconductor layer containing a high concentration of impurities based on the light being applied to the PIN diode. When the light transmittance of the PIN diode is reduced, properties of the PIN diode in an on state may be deteriorated.

According to the present disclosure, the p− type semiconductor layer having a low concentration of impurities is disposed under the p+ type semiconductor layer having a high concentration of impurities to minimize the reduction of light transmittance due to the high concentration of impurities and prevent the ejection of the holes, thereby removing the current leakage.

Similarly, the n type semiconductor layer may be implemented as a multi-n type semiconductor layer including the n+ type semiconductor layer and the n− type semiconductor layer having different concentrations to obtain the same effect.

When the p− type semiconductor layer has a thickness corresponding to 80% to 100% of the thickness of the p+ type semiconductor layer and the n− type semiconductor layer has a thickness corresponding to 40% to 50% of thickness of the n+ type semiconductor layer, the effect may be effectively obtained.

When the p− type semiconductor layer has a thickness thicker than the thickness of the p+ type semiconductor layer, the leakage current characteristic of the PIN diode may be improved, but the light transmittance is lowered and a light efficiency of the PIN diode, that is, sensitivity may be degraded based on the degraded light transmittance.

In addition, when the thickness of the n− type semiconductor layer is more than 50% thicker than the thickness of the n+ type semiconductor layer, a depletion region is reduced and the number of electron-hole pairs (EHP) decreases, thereby degrading light efficiency properties.

In some cases where the thickness of the intrinsic semiconductor layer of the PIN diode is within a range of 1 to 2 μm and the p+ type semiconductor layer has the thickness of 100 Å, the p− type semiconductor layer has a thickness of 80 Å to 100 Å and the n+ type semiconductor layer has a thickness of 500 Å, and the n− type semiconductor layer has a thickness of 200 Å to 250 Å, the light efficiency may be effectively improved and the holes and the electrons may be effectively prevented from being ejected.

In addition, when the p+ type semiconductor layer further contains p type impurities corresponding to 10 to 20 times of p type impurities of the p type semiconductor layer, for example, the p− type semiconductor layer contains the p type impurities corresponding to $\frac{1}{20}$ to $\frac{1}{10}$ of the p type impurities of the p+ type semiconductor layer, the blocking of the light transmittance may be minimized and the ejection of the holes may be minimized.

In addition, when the n+ type semiconductor layer further contains the n type impurities corresponding to five to 10 times of the n type impurities of the n− type semiconductor layer, for example, the n− type semiconductor layer contains n type impurities corresponding to $\frac{1}{10}$ to $\frac{1}{15}$ of n type impurities of the n+ type semiconductor layer, the reduction of the light transmittance may be minimized and the ejection of the electrons may be minimized.

In another aspect of the present disclosure, the p+ type semiconductor layer has the same thickness as the n+ type semiconductor layer and the p− type semiconductor layer has the same thickness as the n− type semiconductor layer to minimize the reduction of the light transmittance and further minimize the occurrence of the leakage current by preventing the ejection of the holes and the electrons.

In some examples, the intrinsic semiconductor layer may be depleted by preventing the ejection of holes in the p type semiconductor layer and electrons in the n type semiconductor layer to minimize the leakage current of the PIN diode when the reverse voltage is applied.

In this case, the p type semiconductor layer and the n type semiconductor layer each generate uniform electric field to equalize a force of pulling holes in the p type semiconductor layer and a force pulling electrons in the n type semiconductor layer, thereby minimizing the holes and the electrons ejected from the semiconductor layers.

Therefore, according to another aspect of the present disclosure, the p+ type semiconductor layer may have the same thickness as the n+ type semiconductor layer and the p− type semiconductor layer may have the same thickness as the n− type semiconductor layer to balance the force of pulling the holes in the p type semiconductor layer and the force of pulling the electrons in the n type semiconductor layer, thereby minimizing the reduction in the light transmittance and minimizing the occurrence of the leakage current.

Figure 5A:
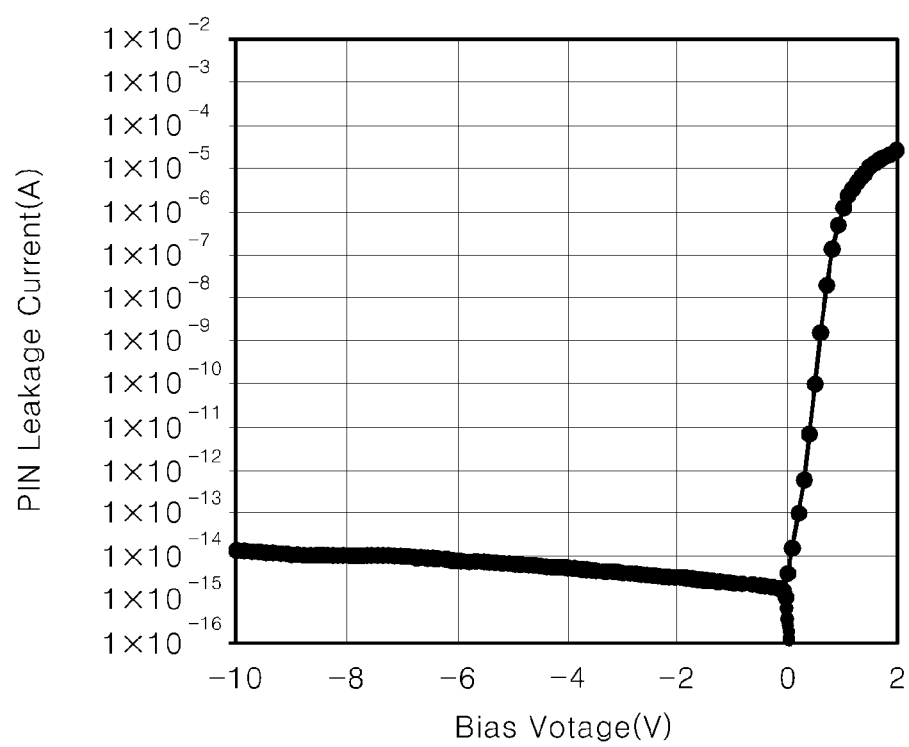
FIG. 5A to 5C respectively show PIN leakage currents in Comparative Example 1, Comparative Example 2, and aspect.
Figure 5B:
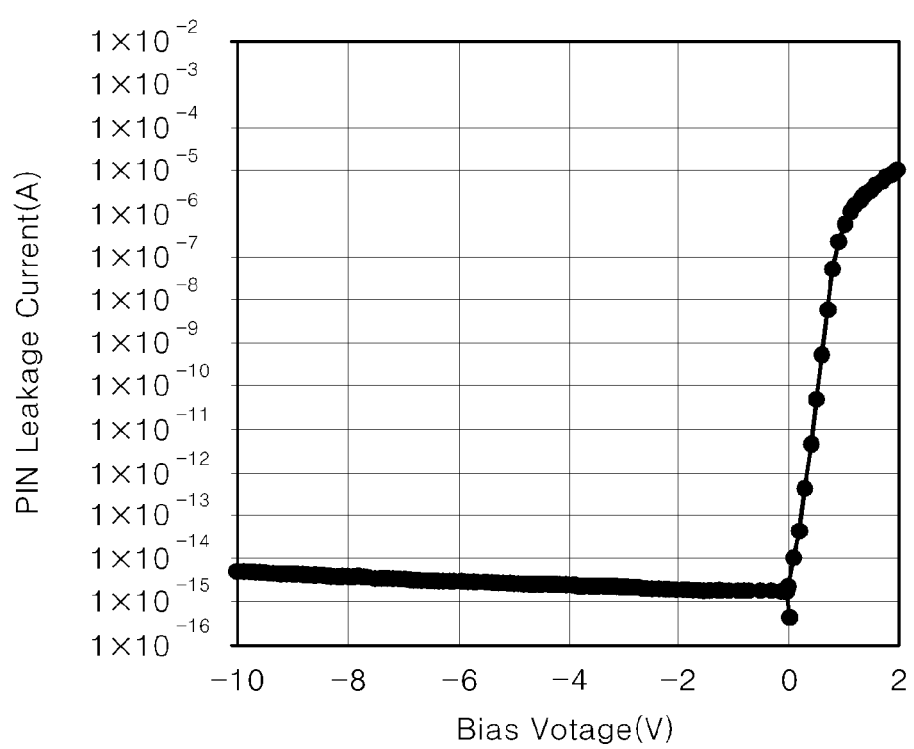
Figure 5C:
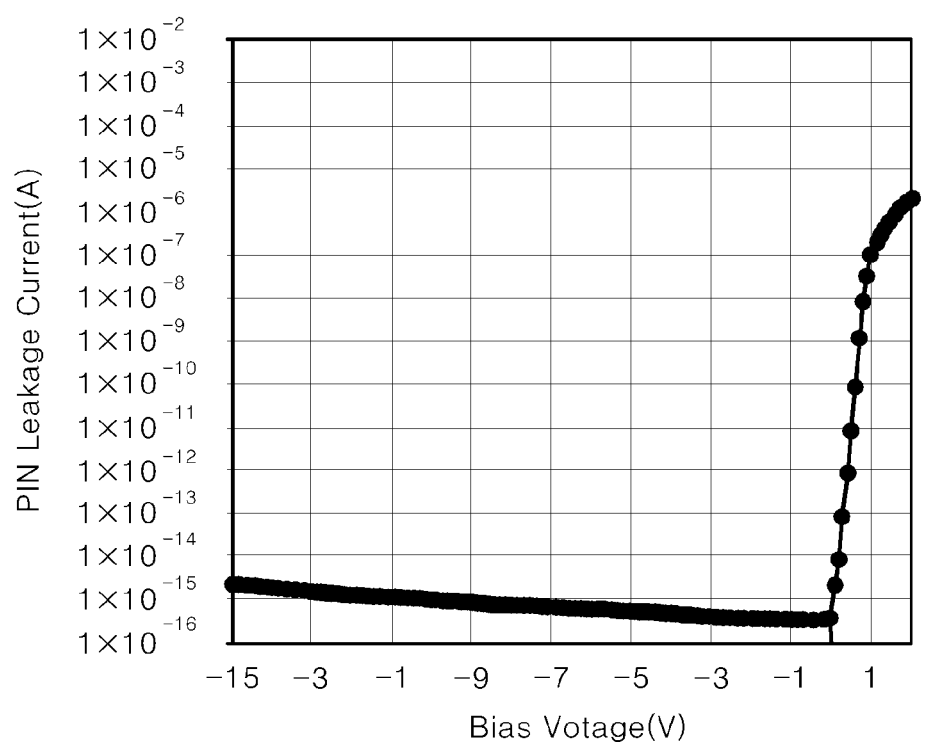

FIGS. 5A and 5B show leakage currents measured by PIN diodes in Comparative Examples 1 and 2 having stacked structures of the PIN diodes. FIG. 5C shows example leakage current of a PIN diode in an aspect having a stacked structure of the PIN diode.

In some examples, FIG. 5A corresponds to Comparative Example 1, in which leakage current of the PIN diode is measured when a digital X-ray detector device including an amorphous silicon (a-Si) thin film transistor and a PIN diode including a p type semiconductor layer, an intrinsic semiconductor layer, and an n type semiconductor layer is in an off state.

In Comparative Example 1, minimum leakage current is 5.5 fA in the off state as shown in FIG. 5A.

FIG. 5B corresponds to Comparative Example 2, in which leakage current of the PIN diode is measured when a digital X-ray detector device including an oxide thin film transistor and a PIN diode including a p type semiconductor layer, an intrinsic semiconductor layer, and an n type semiconductor layer is in an off state.

In Comparative Example 2, a minimum leakage current is 2.74 fA in the off state, as shown in FIG. 5B.

FIG. 5C corresponds to an aspect of the present disclosure, in which leakage current of the PIN diode is measured when a digital X-ray detector device including an oxide thin film transistor and a PIN diode with a p+ type semiconductor layer, a p− type semiconductor layer, an intrinsic semiconductor layer, an n− type semiconductor layer, and an n+ type semiconductor layer is in an off state.

In the aspect, the minimum leakage current is 0.51 fA in the off state as shown in FIG. 5C.

The leakage current in an aspect was drastically reduced compared to Comparative Example 1. The leakage current in the aspect is drastically reduced than the leakage current in Comparative Example 2 targeting the same thin film transistor. For example, the leakage current is reduced from 2.74 fA in the aspect to 0.51 fA in Comparative Example 2. Therefore, the leakage current may be minimized according to the stacked structure of the PIN layer of the PIN diode.

According to the present disclosure, the digital X-ray detector device includes a base substrate, a driving thin film transistor disposed above the base substrate, a PIN diode connected to the driving thin film transistor and including the lower electrode, the PIN layer, and the upper electrode, and the PIN layer includes the p+ type semiconductor layer, the p− type semiconductor layer, the intrinsic semiconductor layer, the n− type semiconductor layer, and the n+ type semiconductor layer.

In this case, the p+-type semiconductor layer and the p− type semiconductor layer each contain p type impurities, the p− type semiconductor layer has a lower concentration of p type impurities than that of the p+ type semiconductor layer, and the p type impurity may contain at least one of Group 3 elements.

The p− type semiconductor layer may have a thickness corresponding to 80% to 100% of a thickness of the p+ type semiconductor layer and the p− type semiconductor layer may contain p type impurities corresponding to $\frac{1}{20}$ to $\frac{1}{10}$ of p type impurities of the p+ type semiconductor layer.

In addition, the n+ type semiconductor layer and the n− type semiconductor layer each contain n type impurities, the n− type semiconductor layer has a lower concentration of n type impurities than that of the n+ type semiconductor layer, and the n type semiconductor layer may include at least one of Group 5 elements.

The n− type semiconductor layer may have a thickness corresponding to 40% to 50% of a thickness of the n+ type semiconductor layer and the n− type semiconductor layer may contain n type impurities corresponding to 1/10 to 1/5 of n type impurities of the n+ type semiconductor layer.

In addition, the p+ type semiconductor layer may have the same thickness as the n+ type semiconductor layer and the p− type semiconductor layer may have the same thickness as the n− type semiconductor layer.

Although the present disclosure has been described with reference to the exemplary drawings, the present disclosure is not limited to the aspects and the drawings disclosed herein, and various modifications can be made by those skilled in the art within the scope of the technical idea of the present disclosure. Further, even if working effects obtained based on configurations of the present disclosure are not explicitly described in the description of aspects of the present disclosure, effects predictable based on the corresponding configuration have to be recognized.

What is claimed is:

1. A thin film transistor array substrate for a digital X-ray detector device, comprising:
    a base substrate;
    a driving thin film transistor disposed above the base substrate; and
    a PIN (p type semiconductor-intrinsic type semiconductor-n type semiconductor) diode connected to the driving thin film transistor and comprising a lower electrode, a PIN layer, and an upper electrode,
    wherein the PIN layer comprises a p+ type semiconductor layer, a p− type semiconductor layer, an intrinsic semiconductor layer, an n− type semiconductor layer, and an n+ type semiconductor layer, and
    wherein the p+ type semiconductor layer and the p− type semiconductor layer each contain p type impurities,
    wherein the p− type semiconductor layer has a lower concentration of p type impurities than a concentration of p type impurities of the p+ type semiconductor layer, and
    wherein the p− type semiconductor layer has a thickness corresponding to 80% to 100% of a thickness of the p+ type semiconductor layer.

2. The thin film transistor array substrate of claim 1, wherein the p type impurity contains at least one of Group 3 elements.

3. A thin film transistor array substrate for a digital X-ray detector device, comprising:
    a base substrate;
    a driving thin film transistor disposed above the base substrate; and
    a PIN (p type semiconductor-intrinsic type semiconductor-n type semiconductor) diode connected to the driving thin film transistor and comprising a lower electrode, a PIN layer, and an upper electrode,
    wherein the PIN layer comprises a p+ type semiconductor layer, a p− type semiconductor layer, an intrinsic semiconductor layer, an n− type semiconductor layer, and an n+ type semiconductor layer,
    wherein the p+ type semiconductor layer and the p− type semiconductor layer each contain p type impurities,
    wherein the p− type semiconductor layer has a lower concentration of p type impurities than a concentration of p type impurities of the p+ type semiconductor layer, and
    wherein the p− type semiconductor layer contains p type impurities corresponding to 1/20 to 1/10 of p type impurities of the p+ type semiconductor layer.

4. A thin film transistor array substrate for a digital X-ray detector device, comprising:
    a base substrate;
    a driving thin film transistor disposed above the base substrate; and
    a PIN (p type semiconductor-intrinsic type semiconductor-n type semiconductor) diode connected to the driving thin film transistor and comprising a lower electrode, a PIN layer, and an upper electrode,
    wherein the PIN layer comprises a p+ type semiconductor layer, a p− type semiconductor layer, an intrinsic semiconductor layer, an n− type semiconductor layer, and an n+ type semiconductor layer,
    wherein the n+ type semiconductor layer and the n− type semiconductor layer each contain n type impurities,
    wherein the n− type semiconductor layer has a lower concentration of n type impurities than a concentration of n type impurities of the n+ type semiconductor layer, and
    wherein the n− type semiconductor layer has a thickness corresponding to 40% to 50% of the thickness of the n+ type semiconductor layer.

5. The thin film transistor array substrate of claim 4, wherein the n type impurity contains at least one of Group 5 elements.

6. A thin film transistor array substrate for a digital X-ray detector device, comprising:
    a base substrate;
    a driving thin film transistor disposed above the base substrate; and
    a PIN (p type semiconductor-intrinsic type semiconductor-n type semiconductor) diode connected to the driving thin film transistor and comprising a lower electrode, a PIN layer, and an upper electrode,
    wherein the PIN layer comprises a p+ type semiconductor layer, a p− type semiconductor layer, an intrinsic semiconductor layer, an n− type semiconductor layer, and an n+ type semiconductor layer,
    wherein the n+ type semiconductor layer and the n− type semiconductor layer each contain n type impurities,
    wherein the n− type semiconductor layer has a lower concentration of n type impurities than a concentration of n type impurities of the n+ type semiconductor layer, and
    wherein the n− type semiconductor layer contains n type impurities corresponding to 1/10 to 1/5 of n type impurities of the n+ type semiconductor layer.

7. A thin film transistor array substrate for a digital X-ray detector device, comprising:
    a base substrate;
    a driving thin film transistor disposed above the base substrate; and
    a PIN (p type semiconductor-intrinsic type semiconductor-n type semiconductor) diode connected to the driving thin film transistor and comprising a lower electrode, a PIN layer, and an upper electrode,
    wherein the PIN layer comprises a p+ type semiconductor layer, a p− type semiconductor layer, an intrinsic semiconductor layer, an n− type semiconductor layer, and an n+ type semiconductor layer, and
    wherein the p+ type semiconductor layer has the same thickness as the n+ type semiconductor layer, and
    wherein the p− type semiconductor layer has the same thickness as the n− type semiconductor layer.

8. A digital X-ray detector device, comprising:
    a base substrate;
    a driving thin film transistor disposed above the base substrate;
    a PIN (p type semiconductor-intrinsic type semiconductor-n type semiconductor) diode connected to the driving thin film transistor and comprising a lower electrode, a PIN layer, and an upper electrode; and
a scintillator layer disposed above the base substrate,
wherein the PIN layer comprises a p+ type semiconductor layer, a p− type semiconductor layer, an intrinsic semiconductor layer, an n− type semiconductor layer, and an n+ type semiconductor layer,
wherein the p+ type semiconductor layer and the p− type semiconductor layer each contain p type impurities,
wherein the p− type semiconductor layer has a lower concentration of p type impurities than a concentration of p type impurities of the p+ type semiconductor layer, and
wherein the p− type semiconductor layer has a thickness corresponding to 80% to 100% of a thickness of the p+ type semiconductor layer.

9. The digital X-ray detector device of claim 8, wherein the p type impurity contains at least one of Group 3 elements.

10. The digital X-ray detector device of claim 8, wherein the p− type semiconductor layer contains p type impurities corresponding to $1/20$ to $1/10$ of p type impurities of the p+ type semiconductor layer.

11. The digital X-ray detector device of claim 8, wherein the n+ type semiconductor layer and the n− type semiconductor layer each contain n type impurities and wherein the n− type semiconductor layer has a lower concentration of n type impurities than a concentration of n type impurities of the n+ type semiconductor layer.

12. The digital X-ray detector device of claim 11, wherein the n type impurity contains at least one of Group 5 elements.

13. The digital X-ray detector device of claim 11, wherein the n− type semiconductor layer has a thickness corresponding to 40% to 50% of the thickness of the n+ type semiconductor layer.

* * * * *